United States Patent
Sung et al.

(10) Patent No.: US 7,764,475 B2
(45) Date of Patent: Jul. 27, 2010

(54) ELECTROSTATIC DISCHARGE CIRCUIT AND METHOD FOR REDUCING INPUT CAPACITANCE OF SEMICONDUCTOR CHIP INCLUDING SAME

(75) Inventors: Myung-Hee Sung, Hwaseong-si (KR); Young-Man Ahn, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 860 days.

(21) Appl. No.: 11/645,528

(22) Filed: Dec. 27, 2006

(65) Prior Publication Data

US 2007/0267701 A1    Nov. 22, 2007

(30) Foreign Application Priority Data

May 22, 2006    (KR) ..................... 10-2006-0045614

(51) Int. Cl.
*H02H 9/00*    (2006.01)
(52) U.S. Cl. ........................ 361/56; 361/91.1
(58) Field of Classification Search ................. 361/56, 361/91.1
See application file for complete search history.

(56) References Cited

U.S. PATENT DOCUMENTS

| | | | |
|---|---|---|---|
| 6,057,998 A * | 5/2000 | Sakamoto et al. | 361/78 |
| 6,671,147 B2 * | 12/2003 | Ker et al. | 361/56 |
| 6,704,180 B2 | 3/2004 | Tyler et al. | |
| 6,747,501 B2 * | 6/2004 | Ker et al. | 327/310 |
| 7,450,357 B2 * | 11/2008 | Chen | 361/56 |
| 7,577,858 B2 * | 8/2009 | Garg et al. | 713/320 |
| 2003/0133237 A1 * | 7/2003 | Hung et al. | 361/56 |
| 2005/0200396 A1 | 9/2005 | Hsu et al. | |
| 2008/0151446 A1 * | 6/2008 | Ker et al. | 361/56 |

* cited by examiner

*Primary Examiner*—Jared J Fureman
*Assistant Examiner*—Christopher J Clark
(74) *Attorney, Agent, or Firm*—Volentine & Whitt, PLLC

(57) ABSTRACT

A multi-mode electrostatic discharge (ESD) circuit for a semiconductor chip comprises first and second ESD diodes. In a first mode, a body voltage greater than a power source voltage of the semiconductor chip is applied to the first ESD diode and a body voltage less than a ground voltage of the semiconductor chip is applied to the second ESD diode. In a second mode, a body voltage substantially equal to the power source voltage of the semiconductor chip is applied to the body of the first ESD diode and a body voltage substantially equal to the ground voltage of the semiconductor chip is applied to the second ESD diode.

21 Claims, 13 Drawing Sheets

ELECTROSTATIC DISCHARGE CIRCUIT AND METHOD FOR REDUCING INPUT CAPACITANCE OF SEMICONDUCTOR CHIP INCLUDING SAME

BACKGROUND OF THE INVENTION

1. Field of the Invention

Embodiments of the invention relate generally to semiconductor chips. More particularly, embodiments of the invention relate to an electrostatic discharge circuit capable of protecting internal circuits of the semiconductor chips from static electricity and methods of reducing an input capacitance of the semiconductor chips.

A claim of priority is made to Korean Patent Application No. 10-2006-0045614, filed on May 22, 2006, the disclosure of which is hereby incorporated by reference in its entirety.

2. Description of Related Art

The ability to withstand high voltage static electricity can have a significant impact on the reliability of semiconductor devices. For example, unless a semiconductor device is designed to withstand static electricity, the semiconductor device can be destroyed by incidental contact with charged objects in the device's environment. The sensitivity of a semiconductor device to the effects of static electricity becomes exacerbated as the size of features in the semiconductor device grow smaller, i.e., as the level of integration in the device increases.

Interactions between a semiconductor device and static electricity can be conceptualized as a momentary flow of current between the device and a statically charged object in the device's environment. The current flow typically results from contact with the charged object. Where current from static electricity flows into internal circuits of the semiconductor device designed to operate at relatively low voltages, the internal circuits can be fatally damaged. To prevent such damage from occurring, semiconductor devices often include a static electricity current path allowing current from static electricity to flow without damaging internal circuits of the devices. Preferably, the current path is capable of discharging a large amount of electrical charge in a short period of time.

The static electricity current path is often implemented by a protection circuit installed between an external signal input pad connected to an external pin of the semiconductor device and an internal circuit. The external pin is typically located so as to readily come in contact with static electricity. Another name for the protection circuit is an electrostatic discharge (ESD) circuit. As an example of the ESD circuit's operation, where static electricity is applied to the ESD circuit, the static electricity passes through the ESD circuit, and therefore internal circuits of the semiconductor device are protected against the static electricity. In addition to protecting the semiconductor device against fatal damage to internal circuits, the ESD circuit is preferably designed to further protect the reliability of the device's operation against the effects of static electricity.

As an example, ESD circuits are desirable for protecting internal circuits and operation of dynamic random access memory (DRAM) devices. The problem of protecting DRAM devices against static electricity becomes increasingly important as the size of the DRAM devices continues to decrease.

Certain environments provide somewhat predictable amounts of static electricity to semiconductor devices such as DRAM devices. For example, when a semiconductor device is manufactured, the device may be passed through a handler lane used for testing products after package assembly. The handler lane may impart static electricity to the device with a low voltage of about 250V, however, the static electricity can be discharged from the handler lane with low impedance. Static electricity discharged in this way can be said to be discharged in a "machine mode."

Another way in which static electricity may be discharged to a semiconductor device is in a "human body mode." In the human body mode, static electricity is discharged from the human body to a semiconductor device when a human user touches a body part to the semiconductor device. Static electricity discharged from a human body to a device typically has a high voltage of about 2000V and is discharged through great impedance.

In order to protect internal circuits of a semiconductor device from being damaged by an inflow of current from static electricity, various protection circuits may be installed in a semiconductor device. One of the protection circuits may be an ESD circuit disposed between an input pad and an input buffer.

FIG. 1 is a circuit diagram of a conventional ESD circuit for a semiconductor device. Referring to FIG. 1, a conventional ESD circuit 10 is connected between an input pad PAD of the semiconductor device and an input buffer 12.

Signals are applied to input pad PAD from an external source outside the semiconductor device. For example, the signals may be applied to input pad PAD through an external pin of a semiconductor package, or before the semiconductor device is packaged, through a tester pin via a prober tip.

Input buffer 12 buffers an external signal applied through input pad PAD, and outputs a buffered signal IN to a next terminal (not shown) of input buffer 12. An input terminal of input buffer 12 is connected to a node N1 and an output terminal of input buffer 12 is connected to a node N2.

ESD circuit 10 is connected between input pad PAD and input buffer 12, to protect input buffer 12 from static electricity. ESD circuit 10 includes two diodes D1 and D2. Diode D1 comprises a positive metal-oxide semiconductor (PMOS) transistor and diode D2 comprises a negative metal-oxide semiconductor (NMOS) transistor.

The PMOS transistor in ESD circuit 10 has a first terminal connected to node N1, a second terminal connected to a power terminal VDD, and a gate connected to the source of the PMOS transistor in ESD circuit 10. In other words, where static electricity is not applied to ESD circuit 10, diode D1 is connected in a reverse bias configuration.

The NMOS transistor in ESD circuit 10 has a first terminal connected to node N1, a second terminal connected to ground VSS, and a gate connected to the second terminal of the NMOS transistor in ESD circuit 10. In other words, where static electricity is not applied to ESD circuit 10, diode D2 is connected in a reverse bias configuration.

Where static electricity having a voltage level higher than power source voltage VDD is applied to input pad PAD, the static electricity is discharged through diode D1. On the other hand, where static electricity having a voltage level lower than ground VSS is applied to input pad PAD, static electricity is discharged through diode D2.

Thus, where static electricity having a higher voltage level than power source voltage VDD is applied to input pad PAD, or where static electricity having a lower voltage level than ground VSS is applied to input pad PAD, ESD circuit 10 discharges a large amount of charge. As a result, input buffer 12 is prevented from being damaged. In general, the static electricity tends to have a voltage level that is significantly higher or lower than power source voltage VDD or ground VSS, respectively.

FIG. 2 is a sectional view schematically illustrating a vertical structure of diode D2 shown in FIG. 1 and FIG. 3 is a sectional view schematically illustrating a vertical structure of diode D1 shown in FIG. 1.

Referring to FIG. 2, diode D2 comprises an NMOS transistor including a gate 24, a source 26, and a drain 27. Gate 24 and source 26 are both connected to ground VSS and drain 27 is connected to a drain voltage Vdrain. In addition, the NMOS transistor includes a p-type body 22 also connected to ground VSS. Each of source 26 and drain 27 are formed by a well comprising a region into which n-type impurities of a high density are implanted. A region 28 is also formed in body 22 by implanting p-type impurities with a high density into body 22. A junction diode JD1 is positioned between body 22 and source 26 of the NMOS transistor and a junction diode JD2 is positioned between body 22 and drain 27 of the NMOS transistor. Although a gate oxide is typically included in the NMOS transistor, no gate oxide is explicitly shown in order to simplify the drawings.

The voltage applied to body 22 prevents a PN junction from forming between circuit elements in a partial forward bias in a semiconductor chip, and further prevents data loss or latchup in memory cells. The voltage applied to body 22 also reduces a change of threshold voltage of the NMOS transistor based on a back-gate effect to obtain a stable operation of the device and improve the device's operating speed. In general, the voltage applied to the body, or bulk, of a transistor may be referred to as a bulk bias voltage.

In diode D2 having the structure illustrated in FIG. 2, where static electricity is applied to input pad PAD (FIG. 1) and therefore drain voltage Vdrain is applied to node N1 (FIG. 1) with a voltage level less than ground VSS, charges are discharged through diode D2. Meanwhile, where static electricity is not applied to input pad PAD (FIG. 1), diode D2 is reverse biased and therefore it has a significant junction capacitance. More particularly, in a normal case, junction diode JD2 between body 22 and drain 27 is reverse biased and therefore diode D2 has a significant junction capacitance. At the same time, junction diode JD1 between body 22 and source 26 is also reverse biased, and therefore has a junction capacitance. However, junction diode JD1 is reverse biased to a smaller degree than junction diode JD2.

Referring to FIG. 3, diode D3 comprises a PMOS transistor including a gate 34, a source 36, and a drain 37. Gate 34 and source 36 are both connected to power source voltage VDD and drain 37 is connected to drain voltage Vdrain. In addition, the PMOS transistor includes a n-type body 32 also connected to power source voltage VDD. Each of source 36 and drain 37 are formed by a well comprising a region into which p-type impurities of a high density are implanted. A region 38 is also formed in body 32 by implanting n-type impurities with a high density into body 32. A junction diode JD3 is positioned between body 32 and source 36 of the PMOS transistor and a junction diode JD4 is positioned between body 32 and drain 37 of the PMOS transistor. Although a gate oxide is typically included in the PMOS transistor, no gate oxide is explicitly shown in order to simplify the drawings.

In diode D1 having the structure illustrated in FIG. 3, where static electricity is applied to input pad PAD (FIG. 1) and therefore drain voltage Vdrain is applied to node N1 (FIG. 1) with a voltage greater than power source voltage VDD, charges are discharged through diode D1. Meanwhile, where static electricity is not applied to input pad PAD (FIG. 1), diode D1 is reverse biased and therefore it has a significant junction capacitance. More particularly, in a normal case, junction diode JD4 between body 32 and drain 37 is reverse biased and therefore diode D1 has a significant junction capacitance. At the same time, junction diode JD4 between body 32 and source 36 is also reverse biased, and therefore has a junction capacitance. However, junction diode JD3 is reverse biased to a smaller degree than junction diode JD4.

In diode D1 having the above-mentioned structure, where static electricity is applied to input pad PAD (FIG. 1) and a drain voltage Vdrain as a node (N1 of FIG. 1) voltage is greater than power source voltage VDD, a charge is discharged through diode D1. Meanwhile, in a normal case where static electricity is not applied to input pad PAD (FIG. 1), diode D1 is reverse biased and has a junction capacitance. That is, in the normal case, junction diode JD4 between body 32 and drain 37 is reverse biased, and therefore diode D1 has a junction capacitance. In addition, a junction capacitance exists between body 32 and source 36.

A semiconductor chip having an ESD circuit such as that illustrated in FIGS. 1-3 has junction capacitances as described above where a relatively small amount of static electricity flows into the semiconductor chip.

The magnitude of input capacitance in the conventional semiconductor devices depends on various factors such as the junction capacitances in the electrostatic discharge circuit. As the performance and capacity of the devices increases, the input capacitance of the devices tends to increase accordingly. For instance, leading edge semiconductor devices often include stack packages in order to increase the performance of the devices. However, using such stack packages tends to increase the overall input capacitance of the devices.

Increasing the input capacitance of semiconductor devices tends to decrease the setup margin of the devices, causing defects in their operation or otherwise degrading their performance. Certain sources of input capacitance cannot be readily modified to reduce the input capacitance. For example, components necessary for proper operation of the chips, such as drivers, cannot be readily modified to reduce the input capacitance in order to overcome the lack of setup margin.

The ability of a memory module to drive a semiconductor device depends on the input capacitance of the semiconductor device. More particularly, the number of semiconductor chips that can be driven by each output pin of a driver of the memory module is limited by the input capacitance of the semiconductor chips. A wide variety of memory module types exist, such as Dual Inline Memory Modules (DIMMs), Unbuffered DIMM (UDIMM), Small Outline DIMM (SODIMM), Registered DIMM (RDIMM), and Fully Buffered DIMM (FB-DIMM), to name but a few. In these memory modules, the input capacitance of semiconductor chips tends to limit the number of semiconductor chips per output pin of a main board controller chip for the UDIMM and the SODIMM, the number of semiconductor chips per output pin of a register for the RDIMM, and the number of semiconductor chips per output pin of an Advanced Memory Buffer (AMB) for the FBDIMM.

Accordingly, decreasing the input capacitance of semiconductor chips may increase the number of semiconductor chips that can be driven by each output pin of a memory module driver and enhance the performance of the memory module and the semiconductor chip.

SUMMARY OF THE INVENTION

Accordingly, selected embodiments of the invention provide ESD circuits capable of reducing the input capacitance of a semiconductor chip. Other embodiments of the invention provide methods for protecting internal circuits of a semiconductor chip from static electricity and reducing an input capacitance of the semiconductor chip.

According to one embodiment of the invention, a multi-mode electrostatic discharge (ESD) circuit for a semiconductor chip comprising an input buffer is provided. The circuit comprises one or more ESD diodes connected to an input terminal of the input buffer and adapted to discharge static electricity applied to the input terminal of the input buffer. The circuit further comprises one or more body voltage varying units adapted to apply one or more respective body voltages to the one or more ESD diodes. Each of the one or more respective body voltages has a voltage level greater than a power source voltage of the ESD circuit or less than a ground voltage of the ESD circuit where the ESD circuit is in a first mode, and further adapted to apply the one or more respective body voltages to the one or more ESD diodes with respective voltage levels equal to the power source voltage of the ESD circuit or the ground voltage of the ESD circuit where the ESD circuit is in a second mode.

According to another embodiment of the invention, a multi-mode electrostatic discharge (ESD) circuit for a semiconductor chip comprising an input buffer is provided. The circuit comprises one or more ESD diodes connected to an input pad acting as an input terminal for an external signal of the semiconductor chip, and further connected to an input terminal of the input buffer, and adapted to discharge static electricity applied to the input pad. The circuit further comprises one or more body voltage varying units adapted to apply one or more respective body voltages to the one or more ESD diodes. Each of the one or more respective body voltages has a voltage level greater than a power source voltage of the ESD circuit or less than a ground voltage of the ESD circuit where the ESD circuit is in a first mode, and further adapted to apply the one or more respective body voltages to the one or more ESD diodes with respective voltage levels equal to the power source voltage of the ESD circuit or the ground voltage of the ESD circuit where the ESD circuit is in a second mode.

According to another embodiment of the invention, a multi-mode electrostatic discharge (ESD) circuit for a semiconductor chip having an input buffer is provided. The circuit comprises first and second ESD diodes, each connected to an input pad provided as an input terminal for an external signal supplied to the semiconductor chip and further connected to the input buffer and providing respective first and second discharge paths for discharging static electricity applied to the input pad. The circuit further comprises a first body voltage varying unit adapted to receive a first selection signal and to generate a body voltage for the first ESD diode based on a voltage level of the first selection signal, which is determined by a mode of the ESD circuit. The circuit still further comprises a second body voltage varying unit adapted to receive a second selection signal and to generate a body voltage for the second ESD diode based on a voltage level of the second selection signal, which is determined by the mode of the ESD circuit. The first body varying unit generates the body voltage for the first ESD diode with a voltage level higher than a power source voltage of the ESD circuit where the mode of the ESD circuit is a first mode, and generates the body voltage for the first ESD diode with a voltage level substantially equal to the power source voltage of the ESD circuit where the mode of the ESD circuit is a second mode. The second body varying unit generates the body voltage for the second ESD diode with a voltage level lower than a ground voltage of the ESD circuit where the mode of the ESD circuit is the first mode, and generates the body voltage for the second ESD diode with a voltage level substantially equal to the ground voltage of the ESD circuit where the mode of the ESD circuit is the second mode.

According to still another embodiment of the invention, a method of reducing an input capacitance of a semiconductor chip having an electrostatic discharge (ESD) circuit is provided. The ESD circuit comprises first and second ESD diodes and is adapted to protect internal circuits of the semiconductor chip from static electricity. The method comprises, in a first mode of the ESD circuit, generating a body voltage for a positive metal-oxide semiconductor (PMOS) transistor included in the first ESD diode with a voltage level substantially equal to a power source voltage of the ESD circuit and generating a body voltage for a negative metal-oxide semiconductor (NMOS) transistor included in the first ESD diode with a voltage level substantially equal to a ground voltage of the ESD circuit. The method further comprises, in a second mode of the ESD circuit, generating the body voltage for the PMOS transistor included in the first ESD diode with a voltage level higher than the power source voltage of the ESD circuit and generating the body voltage for the NMOS transistor included in the second ESD diode with a voltage level lower than the ground voltage of the ESD circuit.

BRIEF DESCRIPTION OF THE DRAWINGS

Embodiments of the invention are described in relation to the accompanying drawings. Throughout the drawings like reference numbers indicate like exemplary elements, components, and steps. In the drawings.

DESCRIPTION OF EXEMPLARY
EMBODIMENTS

Exemplary embodiments of the invention are described below with reference to the corresponding drawings. These embodiments are presented as teaching examples. The actual scope of the invention is defined by the claims.

Figure 1:
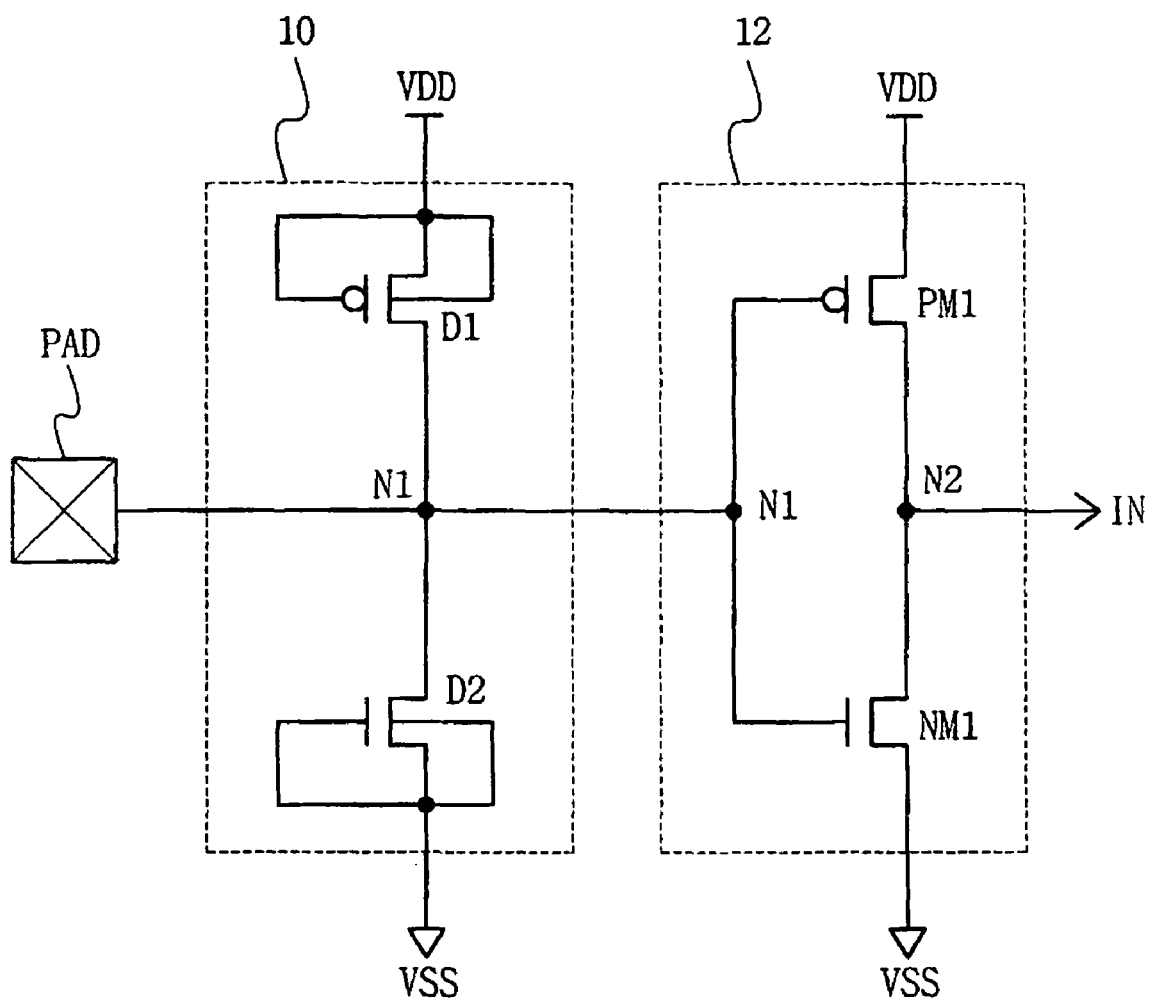
FIG. 1 is a circuit diagram of conventional ESD circuit.
Figure 2:
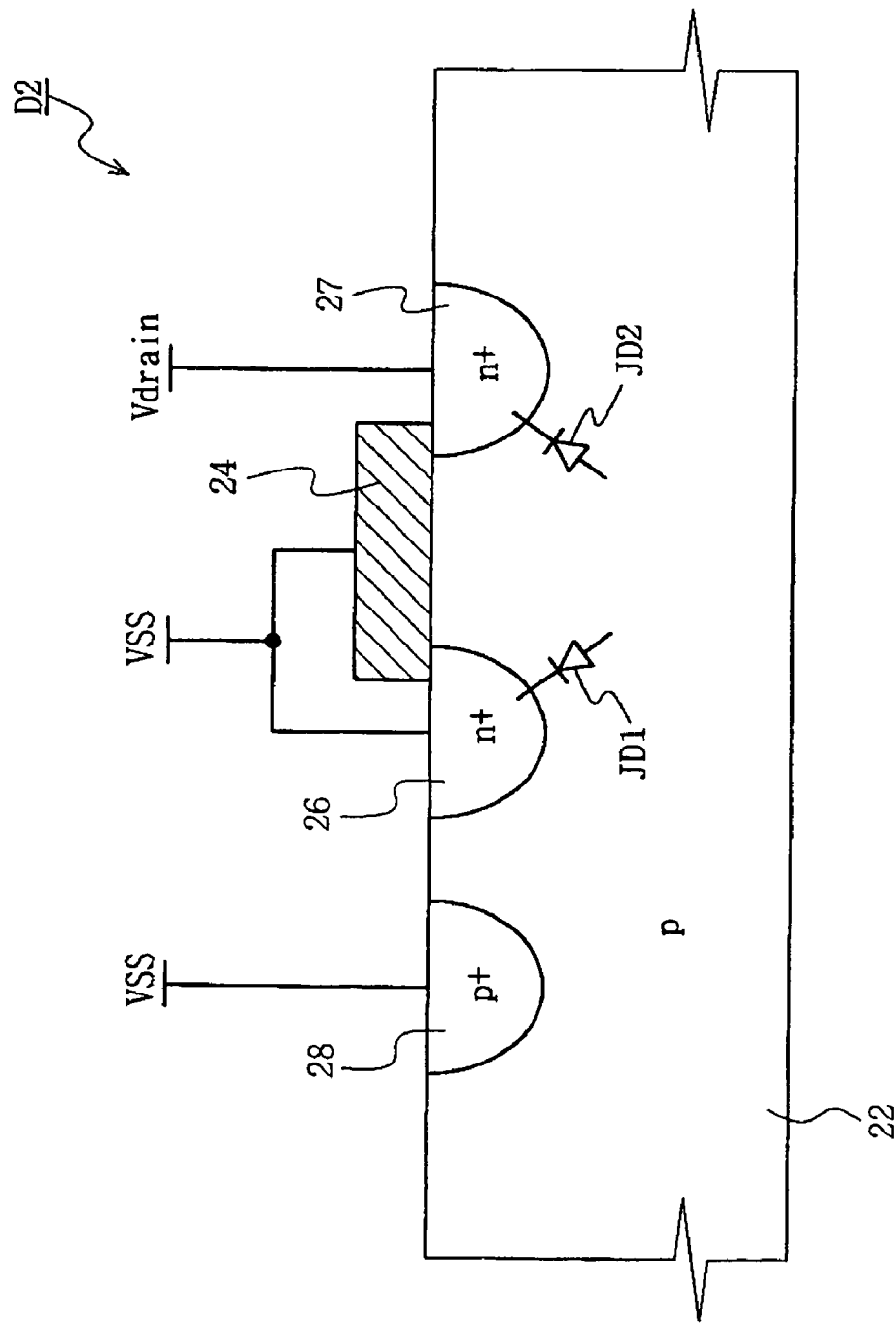
FIG. 2 is a sectional view schematically illustrating a vertical structure of a diode D2 shown in FIG. 1.
Figure 3:
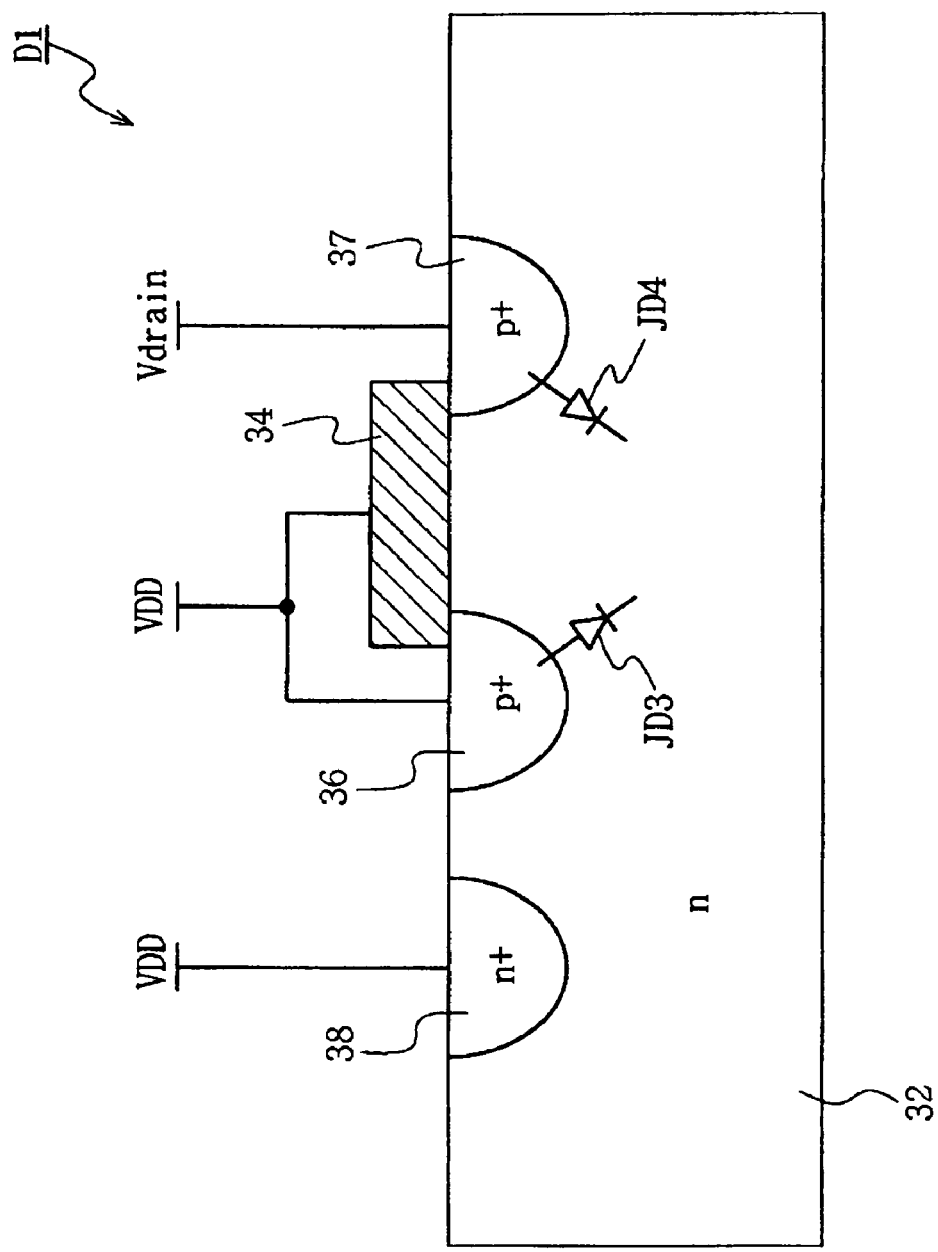
FIG. 3 is a sectional view schematically illustrating a vertical structure of a diode D1 shown in FIG. 1.
Figure 4:
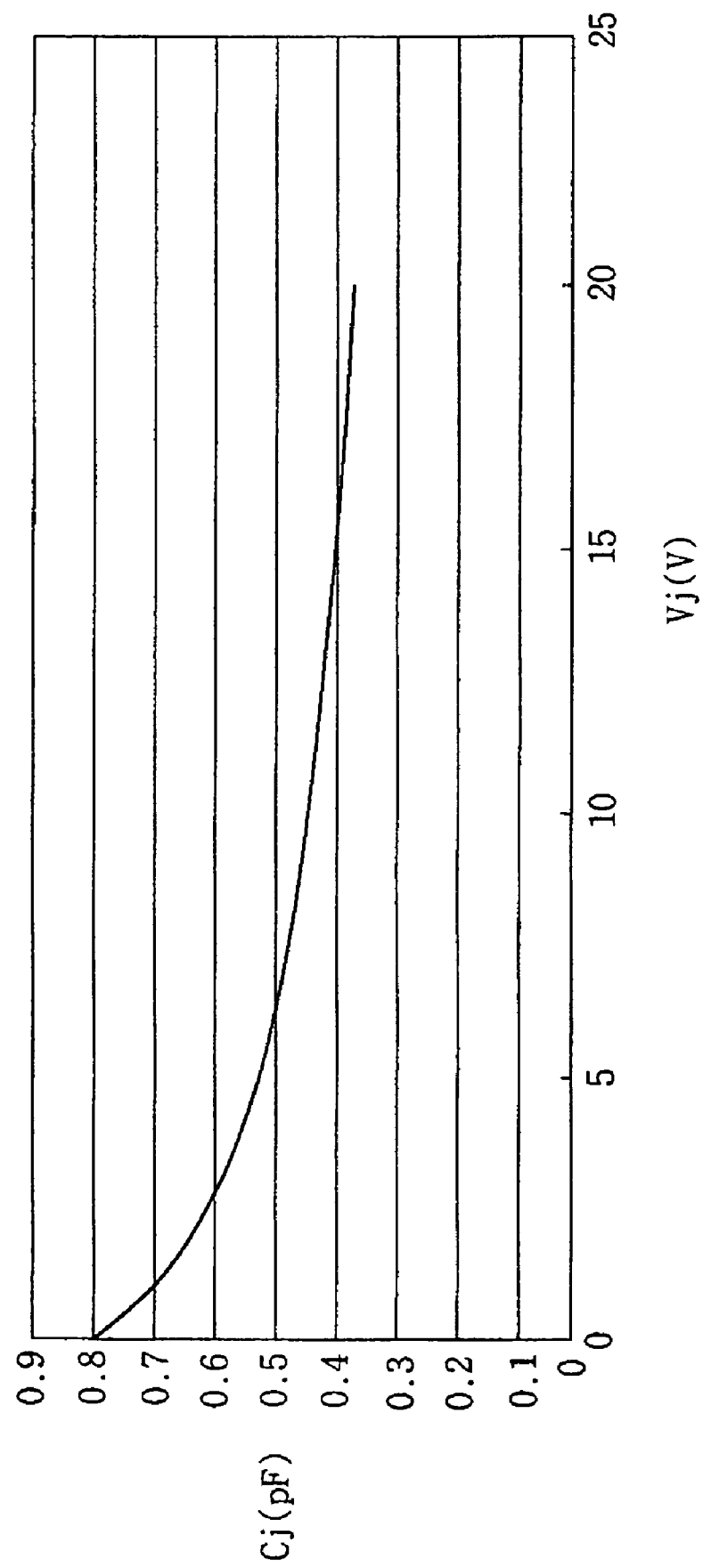
FIG. 4 is a graph illustrating a junction capacitance in a semiconductor device as a function of a reverse bias voltage in the device.

FIG. 4 is a graph illustrating a relationship between a junction capacitance Cj and a reverse bias voltage Vj in a semiconductor device. As seen in FIG. 4, an increase in reverse bias voltage Vj from 0V to 1V reduces junction capacitance Cj by about 0.1 pF. As reverse bias voltage Vj increases further, junction capacitance Cj decreases further.

The relationship between junction capacitance Cj and reverse bias voltage Vj can be expressed mathematically by the following equation (1):

$$Cj = Cjo / \{(1+Vj/\phi)^m\}. \qquad (1)$$

In equation (1), the term Cjo denotes a junction capacitance in the absence of reverse bias voltage Vj, the term $\phi$ denotes a built-in voltage of a PN junction, and the term "m" is set to ½. As illustrated by equation (1), junction capacitance Cj in an ESD circuit can be changed by controlling reverse bias voltage Vj in the circuit.

In order to reduce overall input capacitance of a semiconductor device while still providing the device with protection against static electricity, EDC circuits may be provided wherein the voltage levels applied to semiconductor substrates within the EDC circuits can be modified according to the number of semiconductor chips in the semiconductor device. As an example, in a memory module comprising multiple semiconductor chips, each semiconductor chip may include its own EDC circuit to protect it against static electricity. However, in a device including multiple semiconductor chips, each individual semiconductor chip is less susceptible to the harms of static electricity than a single semiconductor chip formed by itself in a device. In addition, as the number of semiconductor chips in the device increases, the input capacitance of the device tends to increase accordingly. Therefore, the input capacitance of each semiconductor chip can be reduced by modifying the levels of voltages applied to respective transistor bodies within the EDC circuits of the semiconductor chips.

Figure 5:
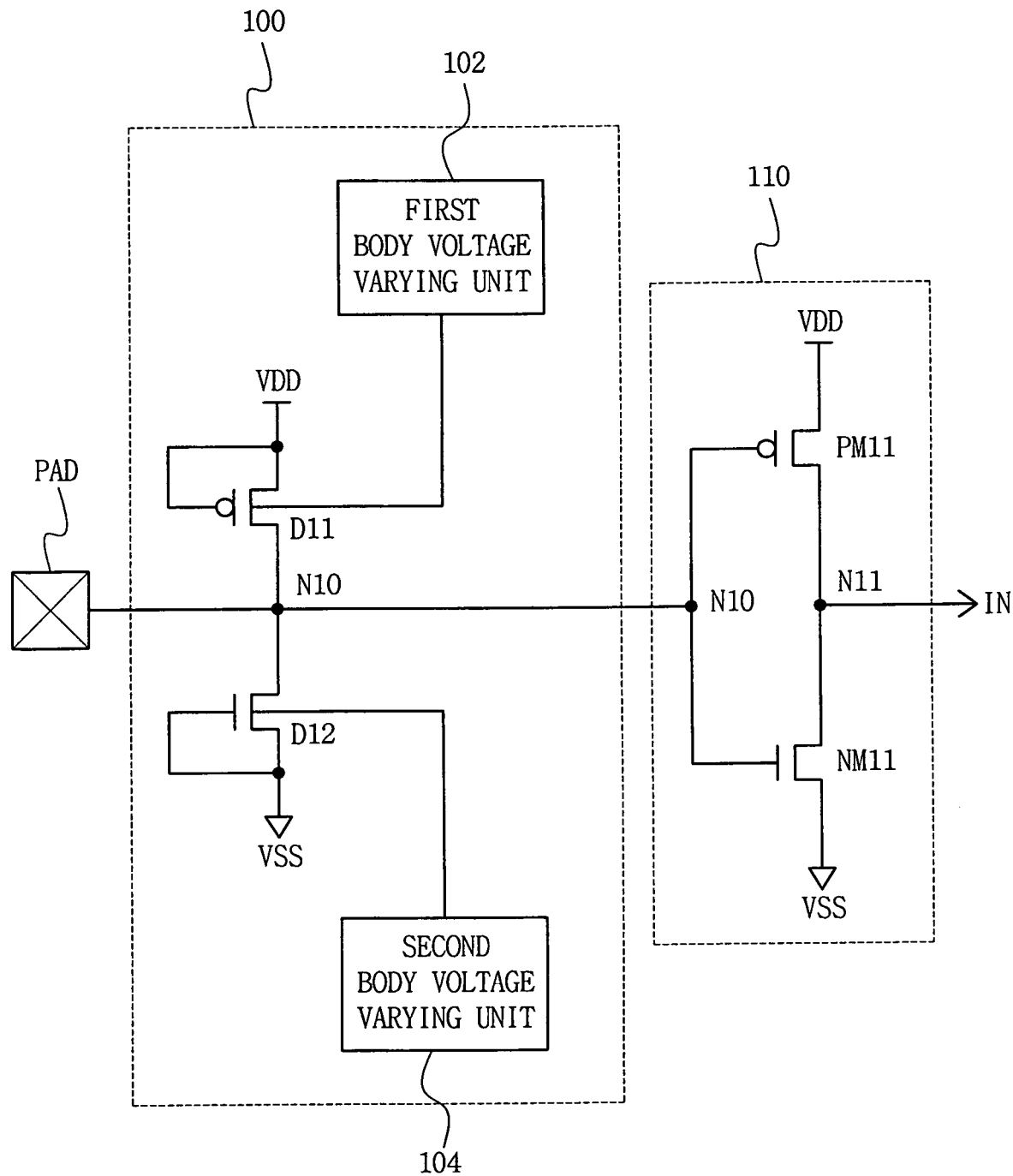
FIG. 5 is a circuit diagram of an ESD circuit according to selected embodiments of the invention.

FIG. 5 is a circuit diagram of an ESD circuit for a semiconductor chip according to selected embodiments of the invention. Referring to FIG. 5, an ESD circuit 100 is connected between an input pad PAD and an input buffer 110.

Input pad PAD is connected to an external pin and receives an input signal from an external source. ESD circuit 100 protects internal circuits of the semiconductor chip, such as input buffer 110, from static electricity. Input buffer 110 is configured to buffer the input signal received by input pad PAD and to output the buffered input signal IN to one or more internal circuits in the semiconductor chip.

ESD circuit 100 protects internal circuits of the semiconductor chip from static electricity, and includes first and second ESD diodes D11 and D12 and first and second body voltage varying units 102 and 104.

First and second ESD diodes D11 and D12 provide paths through which static electricity can be discharged when the static electricity is applied to a node N10, which forms an input terminal for input buffer 110, through input pad PAD. Body voltage varying units 102 and 104 are configured to apply respective voltages to first and second ESD diodes D11 and D12, where the respective voltages have voltage levels different from power source voltage VDD or ground VSS.

Among first and second ESD diodes D11 and D12, first ESD diode D11 is connected between power source voltage VDD and node N1. First ESD diode D11 comprises a PMOS transistor having a drain connected to node N10, and a source and a gate both connected to power source voltage VDD. First ESD diode D11 provides an electrical path that is reverse biased when static electricity is not applied to node N10, and through which static electricity is discharged when static electricity is applied to node N10.

The PMOS transistor in first ESD diode D11 has a body voltage that is controlled by first body voltage unit 102. For example, first body voltage varying unit 102 may vary the body voltage of the PMOS transistor in ESD diode D11 to a voltage VPP higher than power source voltage VDD where buffered input signal IN drives multiple semiconductor chips in a memory module. In comparing the influence of static electricity in a memory module comprising multiple semiconductor chips, and a memory module comprising only a single semiconductor chip, the electrostatic influence of the static electricity tends to be more pronounced in the single semiconductor chip. Accordingly, ESD circuits tend to play a more significant role in protecting single semiconductor chips.

Where the body voltage of the PMOS transistor in ESD diode D11 is changed to a voltage VPP, which is higher than power source voltage VDD, the input capacitance of the semiconductor chip containing ESD circuit 100 decreases accordingly. In other words, increasing the body voltage of the PMOS transistor in ESD diode D11 tends to increase a reverse bias voltage of a parasitic diode, thereby reducing the input capacitance of the semiconductor chip, as illustrated by equation (1) and FIG. 4.

Figure 6:
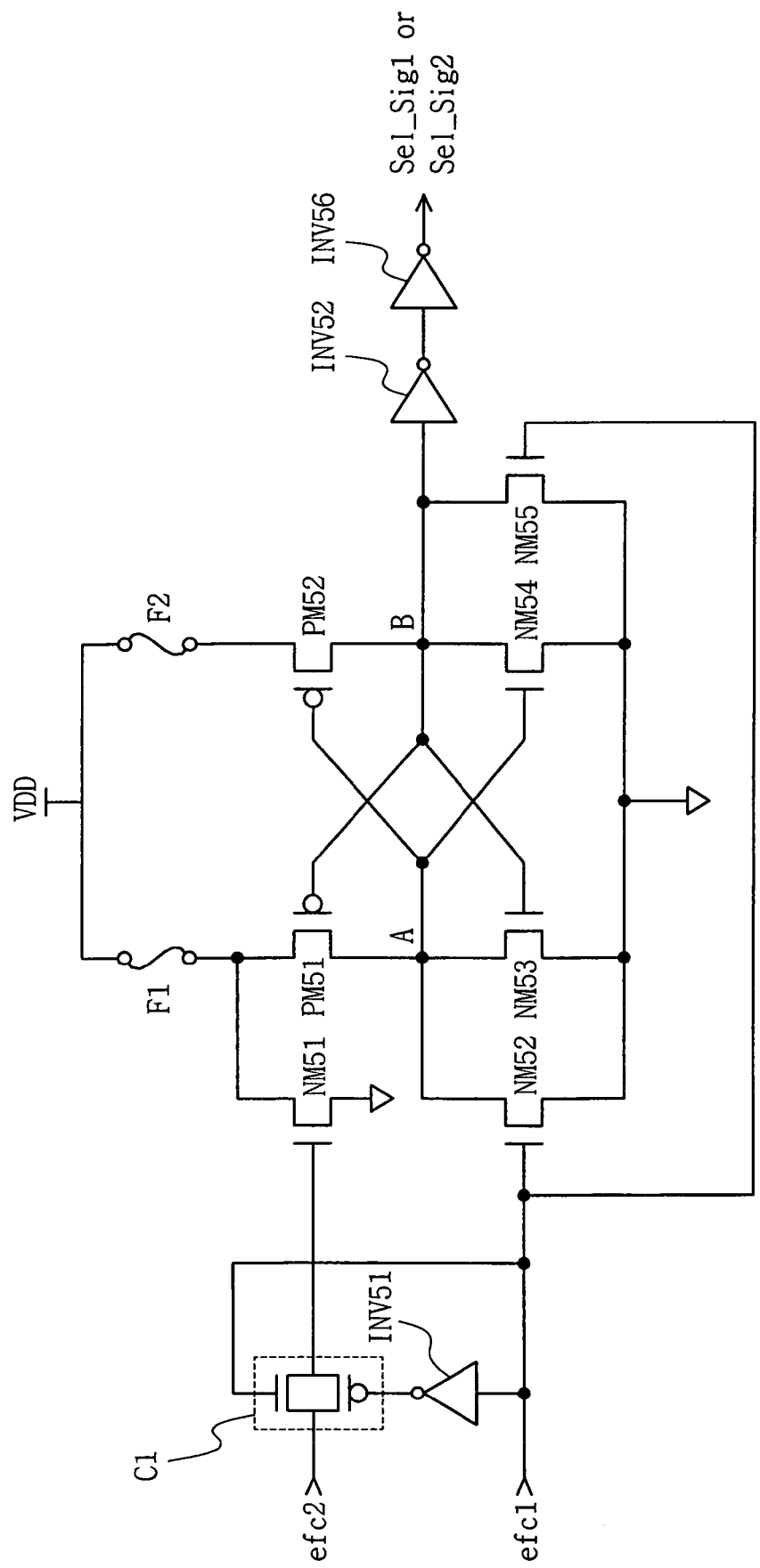
FIG. 6 is a circuit diagram illustrating an electrical fuse circuit constituting one possible implementation of a first body voltage varying unit or a second body voltage varying unit illustrated in FIG. 5.

The voltage VPP higher than power source voltage VDD may be generated by a conventional boosted voltage generator (VPP generator), and first body voltage varying unit 102 may be configured to be programmed, for example, by a fuse or anti-fuse as shown in an example of FIG. 6. In other words, where ESD circuit 100 resides in a sole semiconductor chip of in a semiconductor device, the body voltage of the PMOS transistor in ESD diode D11 is provided as power source voltage VDD; conversely, where ESD circuit 100 resides in one of multiple semiconductor chips in a semiconductor device such as a memory module, the body voltage of the PMOS transistor in ESD diode D11 is provided as voltage VPP, which is higher than power source voltage VDD.

Second ESD diode D12 is connected between ground VSS and node N10. Second ESD diode D12 typically comprises a NMOS transistor having a drain connected to node N10 and a source and a gate both connected to ground VSS. Thus, second ESD diode D12 provides an electrical path which is reverse biased when static electricity is not applied to node N10, and through which static electricity is discharged when static electricity is applied to node N10.

A body voltage of the NMOS transistor in second ESD diode D12 is controlled by second body voltage varying unit 104. Second body voltage varying unit 104 varies the body voltage of the NMOS transistor in second ESD diode D12 to a voltage VBB, which is lower than ground voltage VSS, when ESD circuit 100 is connected to a plurality of semiconductor chips in a memory module through input buffer 110. Where the body voltage of the NMOS transistor in ESD diode D12 is varied to voltage VBB lower than the ground voltage VSS, the input capacitance of the semiconductor chips in the memory module tends to decrease. Decreasing the body voltage of the NMOS transistor in second ESD diode D12 increases a reverse bias voltage of second ESD diode D12, and therefore reduces input capacitance, as illustrated by equation (1) and FIG. 4.

Voltage VBB can be generated, for example, by a conventional low voltage generator (VBB generator), and second body voltage varying unit 104 may be configured to be programmed, for example, by a fuse or anti-fuse similar to first body voltage varying unit 102, as shown in an example of FIG. 6. In other words, where ESD circuit 100 resides in a sole semiconductor chip of in a semiconductor device, the body voltage of the NMOS transistor in second ESD diode D12 is provided as ground VSS; conversely, where ESD circuit 100 resides in one of multiple semiconductor chips in a semiconductor device such as a memory module, the body voltage of the NMOS transistor in ESD diode D12 is provided as voltage VBB, which is lower than ground VSS.

FIG. 6 is a circuit diagram illustrating one potential implementation of first or second body voltage varying unit 102 or 104 in FIG. 5 using an electrical fuse circuit.

Referring to FIG. 6, the electrical fuse circuit comprises first and second fuses F1 and F2, where fuse F1 has a smaller resistance value than fuse F2. The electrical fuse circuit further comprises first through third inverters INV51, INV52, and INV56, first and second PMOS transistors PM51 and PM52, first through fifth NMOS transistors NM51, NM52, NM53, NM54, and NM55, and a CMOS transmission gate C1.

First and second fuses F1 and F2 are connected between power source voltage VDD and respective first terminals of first and second PMOS transistors PM51 and PM52. In addition, first and second PMOS transistors have respective second terminals connected to nodes A and B, respectively. Moreover, first PMOS transistor PM51 has a gate connected to node A and second PMOS transistor PM52 has a gate connected to node B.

First NMOS transistor NM51 has a first terminal connected to the first terminal of first PMOS transistor PM51, a second terminal connected to ground, and a gate connected to an output of CMOS transmission gate C1. Second NMOS transistor NM52 has a first terminal connected to node A, a second terminal connected to ground, and a gate connected to a first electrical fuse control signal "efc1". Third NMOS transistor NM53 has a first terminal connected to node A, a second terminal connected to ground, and a gate connected to node B. Fourth NMOS transistor NM54 has a first terminal connected to node B, a second terminal connected to ground, and a gate connected to node A. Fifth NMOS transistor NM55 has a first terminal connected to node B, a second terminal connected to ground, and a gate connected to first electrical fuse control signal "efc1".

First inverter INV51 receives and inverts first electrical fuse control signal "efc1" to output an inverted first electrical fuse control signal. Second inverter INV52 receives and inverts a signal apparent at node B and produces an output signal. Third inverter INV53 receives and inverts the output signal of second inverter INV52 to produce an output signal Sel_sig1 or Sel_sig2, depending on whether the electrical fuse circuit corresponds to first or second body voltage varying unit 102 or 104, respectively.

CMOS transmission gate C1 receives a second electrical fuse control signal efc2 and has an output connected to the gate of first NMOS transistor NM51. CMOS transmission gate C1 is turned on where first electrical fuse control signal efc1 has a logic level "high" and so that the first electrical fuse control signal efc1 is applied to a first control terminal of CMOS transmission gate with logic level "high" and the inverted first electrical fuse control signal is applied to a second control terminal of CMOS transmission gate C1 with a logic level "low". In FIG. 6, the first and second control terminals of CMOS transmission gate C1 are respectively shown at upper and lower portions of CMOS transmission gate C1.

Where CMOS transmission gate C1 is turned on and second electrical fuse control signal efc2 has logic level "low," first NMOS transistor NM51 is turned off and therefore fuse F1 is not cut off. In addition, first electrical fuse control signal efc1 with logic level "high," turns on NMOS transistors NM52 and NM55. As a result, a voltage apparent at node A (an "A" voltage) is a little higher than a voltage apparent at node B (a "B" voltage). Thus, output signal Sel_sig1 or Sel_sig2 assumes logic level "low".

On the other hand, where first electrical fuse control signal efc1 has logic level "high" and second electrical fuse control signal efc2 also has logic level "high," first NMOS transistor NM51 turns on and fuse F1 is cut off. Again, second and fifth NMOS transistors NM52 and NM55 are turned on by first electrical control signal efc1 having logic level "high." In this case, however, the "A" voltage is lower than the "B" voltage, and therefore output signal Sel_sig1 or Sel_sig2 is output with logic level "high".

Output signal Sel_sig1 or Sel_sig2 of the electrical fuse circuit may be used so that where ESD circuit 100 resides in a sole semiconductor chip of a semiconductor device, power source voltage VDD and ground VSS are applied to body first ESD diode D11 and second ESD diode D12, respectively, and where ESD circuit 100 resides in one of several semiconductor chips in a semiconductor device such as a memory module, a voltage VPP higher than power source voltage VDD and a voltage VBB lower than ground voltage VSS are applied to the body of first ESD diode D11 and second ESD diode D12, respectively.

One characteristic of the electrical fuse circuit of FIG. 6 is that once fuse F1 is blown, the body voltages connected to first and second ESD diodes D11 and D12 remain fixed VPP and VBB. However, in various embodiments of ESD circuits, illustrated in FIG. 7, a selection signal may be used to control the respective body voltages so that they are not fixed at VPP or VBB.

Figure 7:
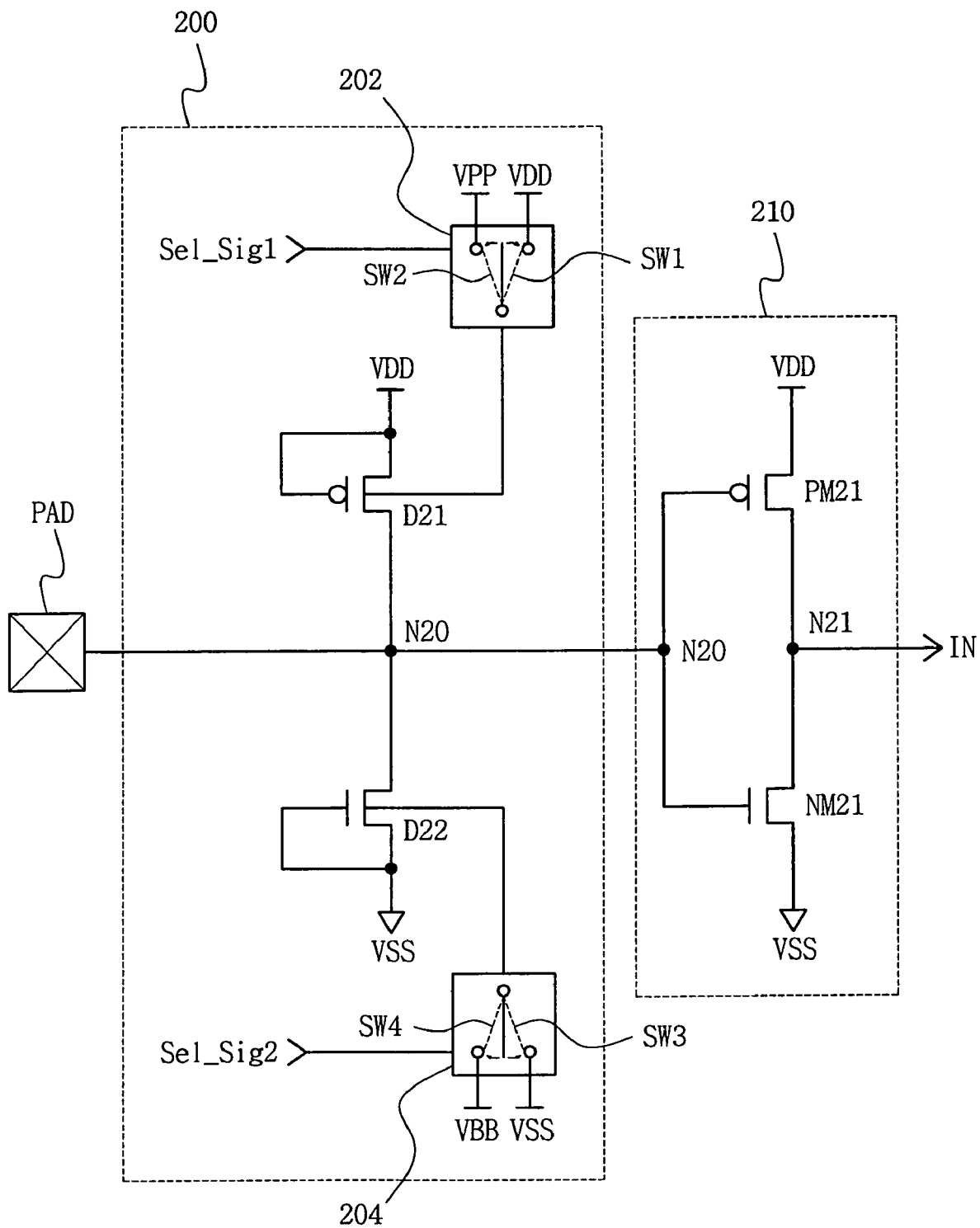
FIG. 7 is a circuit diagram of an ESD circuit according to further embodiments of the invention.

FIG. 7 is a circuit diagram of an ESD circuit 200 for a semiconductor device according to further embodiments of the invention. Referring to FIG. 7, ESD circuit 200 is connected between an input pad PAD and an input buffer 210.

Input pad PAD is connected to an external pin and receives an input signal from an external source. ESD circuit 200 protects internal circuits of the semiconductor device such as input buffer 210, from static electricity. Input buffer 210 is configured to buffer the input signal received by input pad PAD and to output the buffered input signal IN to one or more semiconductor chips within the semiconductor device. For example, input buffer 210 may output buffered input signal IN to several semiconductor chips in a memory module.

ESD circuit 200 protects internal circuits of the semiconductor device from static electricity, and includes first and second ESD diodes D21 and D22 and first and second body voltage varying units 202 and 204.

First and second ESD diodes D21 and D22 provide paths through which static electricity can be discharged when the static electricity is applied to a node N20, which forms an input terminal for input buffer 210, through input pad PAD. Body voltage varying units 202 and 204 are configured to apply respective voltages to first and second ESD diodes D21 and D22, where the respective voltages have voltage levels different from power source voltage VDD or ground VSS.

Among first and second ESD diodes D21 and D22, first ESD diode D21 is connected between power source voltage VDD and node N20. First ESD diode D21 comprises a PMOS transistor having a drain connected to node N20, and a source and a gate both connected to power source voltage VDD. First ESD diode D21 provides an electrical path that is reverse biased when static electricity is not applied to node N20, and through which static electricity is discharged when static electricity is applied to node N20.

The PMOS transistor in first ESD diode D21 has a body voltage that is controlled by first body voltage unit 202. For example, first body voltage varying unit 202 may vary the body voltage of the PMOS transistor in ESD diode D21 to a voltage VPP higher than power source voltage VDD where ESD circuit 200 resides in a sole semiconductor chip in a semiconductor device. In comparing the influence of static electricity in a semiconductor device such as a memory module comprising multiple semiconductor chips, and a semiconductor device comprising only a single semiconductor chip, the electrostatic influence of the static electricity tends to be more pronounced in the single semiconductor chip. Accordingly, the ESD circuit tends play a more significant role in protecting the single semiconductor chip.

Where the body voltage of the PMOS transistor in ESD diode D21 is changed to voltage VPP higher than power source voltage VDD, an input capacitance for the multiple semiconductor chips in the memory module is reduced. In other words, increasing the body voltage of the PMOS transistor in ESD diode D21 tends to increase a reverse bias voltage of a parasitic diode, thereby reducing input capacitance, as illustrated by equation (1) and FIG. 4.

Voltage VPP, which is higher than power source voltage VDD may be generated by a conventional boosted voltage generator (VPP generator), and first body voltage varying unit 202 may be configured to output voltage VPP where ESD circuit 200 is used in semiconductor device containing multiple semiconductor chips.

First body voltage varying unit 202 receives a first selection signal Sel_sig1, and performs a control so that the body voltage of first ESD diode D21 becomes higher than power source voltage VDD where input buffer 210 is connected to a plurality of chips in a memory module. That is, first selection signal Sel_sig1 is applied to first body voltage varying unit 202, and so first body voltage varying unit 202 supplies power source voltage VDD to the body of first ESD diode D21 (SW1), or supplies a voltage VPP higher than power source voltage VDD (SW2).

Second ESD diode D22 is connected between ground VSS and node N20. Second ESD diode D22 typically comprises a NMOS transistor having a drain connected to node N20 and a source and a gate both connected to ground VSS. Thus, second ESD diode D22 provides an electrical path which is reverse biased when static electricity is not applied to node N20, and through which static electricity is discharged when static electricity is applied to node N20.

A body voltage of the NMOS transistor in second ESD diode D22 is controlled by second body voltage varying unit 204. Second body voltage varying unit 204 varies the body voltage of the NMOS transistor in second ESD diode D22 to a voltage VBB, which is lower than ground voltage VSS, where ESD circuit 200 resides in one of multiple semiconductor chips of a semiconductor device. Where the body voltage of the NMOS transistor in ESD diode D22 is varied to voltage VBB lower than the ground voltage VSS, the input capacitance of the semiconductor chips in the semiconductor device tends to decrease. Decreasing the body voltage of the NMOS transistor in second ESD diode D12 increases a reverse bias voltage of second ESD diode D12, and therefore reduces input capacitance, as illustrated by equation (1) and FIG. 4.

Similarly, voltage VBB, which is lower than ground VSS, may be generated by a conventional boosted voltage generator (VBB generator), and second body voltage varying unit 204 may be configured to output voltage VBB where ESD circuit 200 is included in one of multiple semiconductor chips in a semiconductor device such as a memory module.

Second body voltage varying unit 204 receives a second selection signal Sel_sig2, and performs a control operation so that the body voltage of second ESD diode D22 becomes lower than ground VSS where input buffer 210 is used to drive a plurality of chips in a memory module. That is, second selection signal Sel_sig2 is applied to second body voltage varying unit 204, and second body voltage varying unit 204 supplies ground voltage VSS to the body of second ESD diode D22 (SW3), or supplies a voltage VBB lower than ground voltage VSS (SW4).

Figure 8:
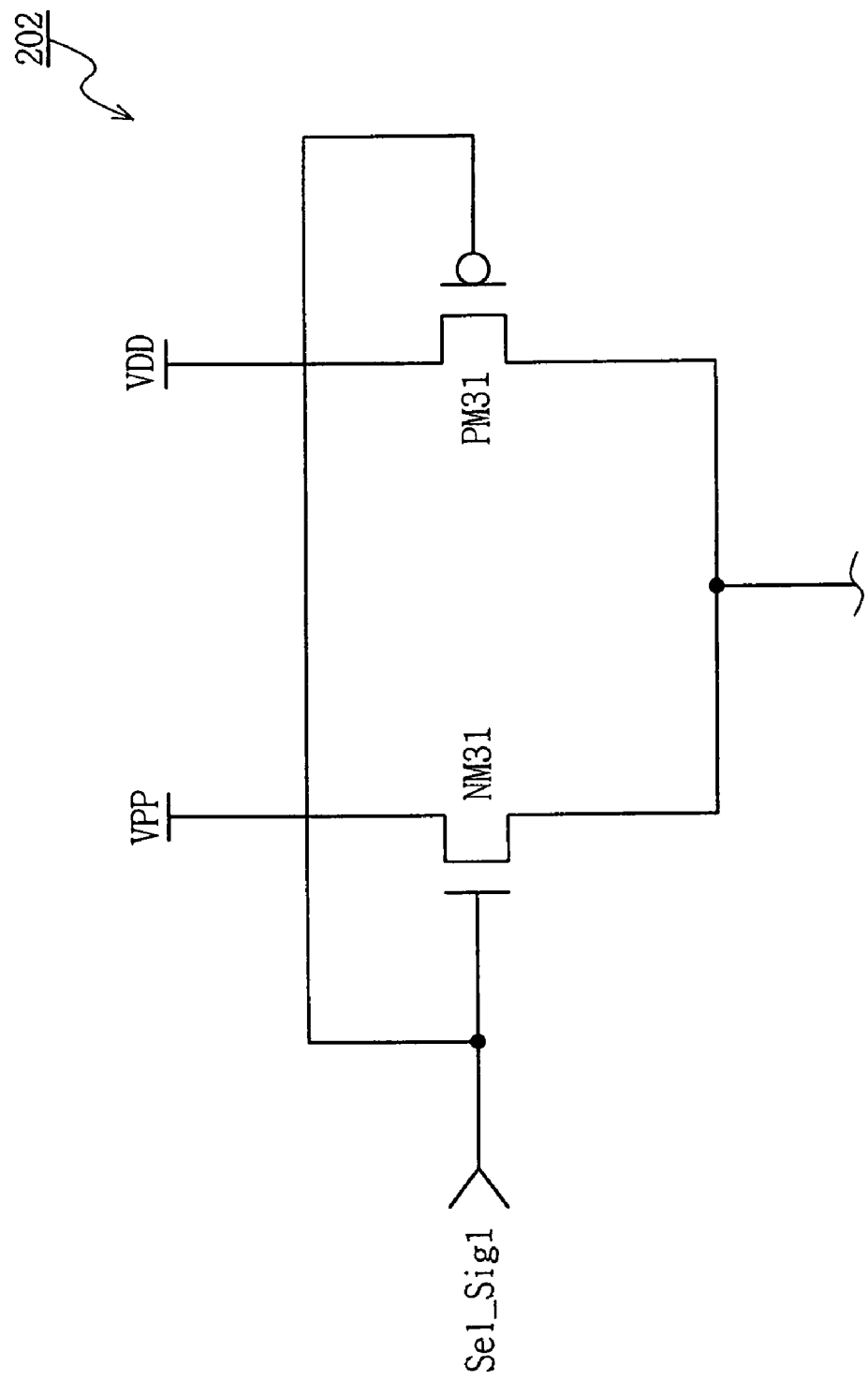
FIG. 8 is a circuit diagram illustrating a possible implementation of a first body voltage varying unit illustrated in FIG. 7.

FIG. 8 is a circuit diagram illustrating an example of first body voltage varying unit 202 shown in FIG. 7. Referring to FIG. 8, first body voltage varying unit 202 comprises a NMOS transistor NM31 and a PMOS transistor PM31.

NMOS transistor NM31 and PMOS transistor PM31 are actuated by first selection signal Sel_Sig1 such that NMOS transistor NM31 turns on and PMOS transistor PM31 turns off where EDC circuit 200 is connected to a plurality of semiconductor chips in a memory module through input buffer 210, and NMOS transistor NM31 turns off and PMOS transistor PM31 turns on where EDC circuit 200 is connected to a single semiconductor chip through input buffer 210. Accordingly, where EDC circuit 200 is included in one of multiple semiconductor chips of a semiconductor device, first body voltage varying unit 202 provides voltage VPP as its output voltage, and where EDC circuit 200 is included in a sole semiconductor chip of a semiconductor device, first body voltage varying unit 202 provides power source voltage VDD as its output voltage. Accordingly, the body voltage of the PMOS transistor in EDC diode D21 can be varied in accordance with first selection signal Sel_Sig1.

Figure 9:
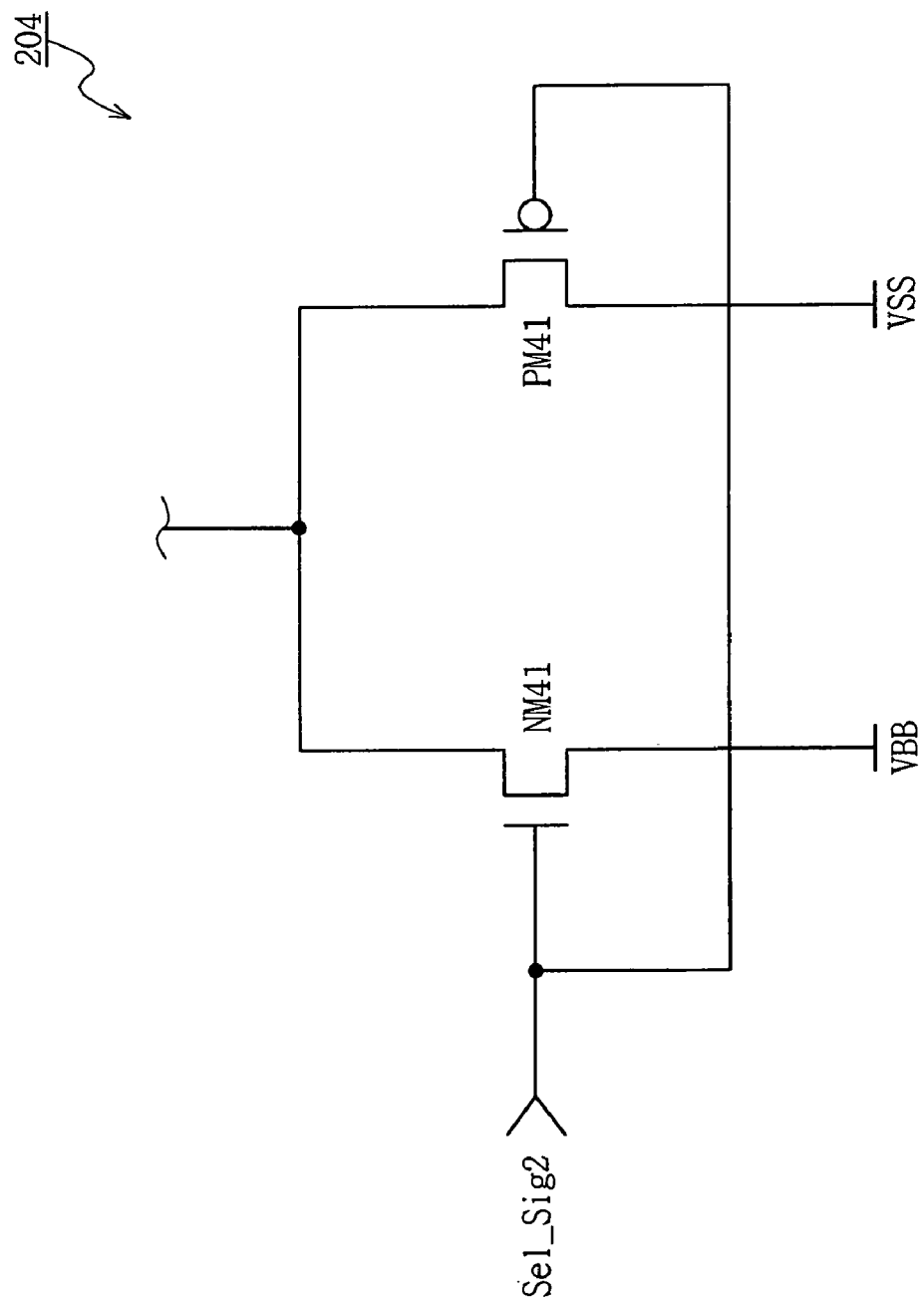
FIG. 9 is a circuit diagram illustrating a possible implementation of a second body voltage varying unit illustrated in FIG. 7.

FIG. 9 is a circuit diagram illustrating an example of second body voltage varying unit 204 shown in FIG. 7. Referring to FIG. 9, second body voltage varying unit 204 comprises a NMOS transistor NM41 and a PMOS transistor PM41.

NMOS transistor NM41 and PMOS transistor PM41 are actuated by second selection signal Sel_Sig2 such that NMOS transistor NM41 turns on and PMOS transistor PM41 turns off where EDC circuit 200 is connected to a plurality of semiconductor chips in a memory module through input buffer 210, and NMOS transistor NM41 turns off and PMOS transistor PM41 turns on where EDC circuit 200 is connected to a single semiconductor chip through input buffer 210. Accordingly, where EDC circuit 200 is included in one of multiple semiconductor chips of a semiconductor device, second body voltage varying unit 204 provides voltage VPP as its output voltage, and where EDC circuit 200 is included in a sole semiconductor chip of a semiconductor device, second body voltage varying unit 204 provides power source voltage VDD as its output voltage. Accordingly, the body voltage of the NMOS transistor in EDC diode D22 can be varied in accordance with second selection signal Sel_Sig2.

First and second body voltage varying units 202 and 204 shown in FIGS. 8 and 9 are teaching examples, and could be modified in various ways or substituted with different types of voltage varying units.

Figure 10:
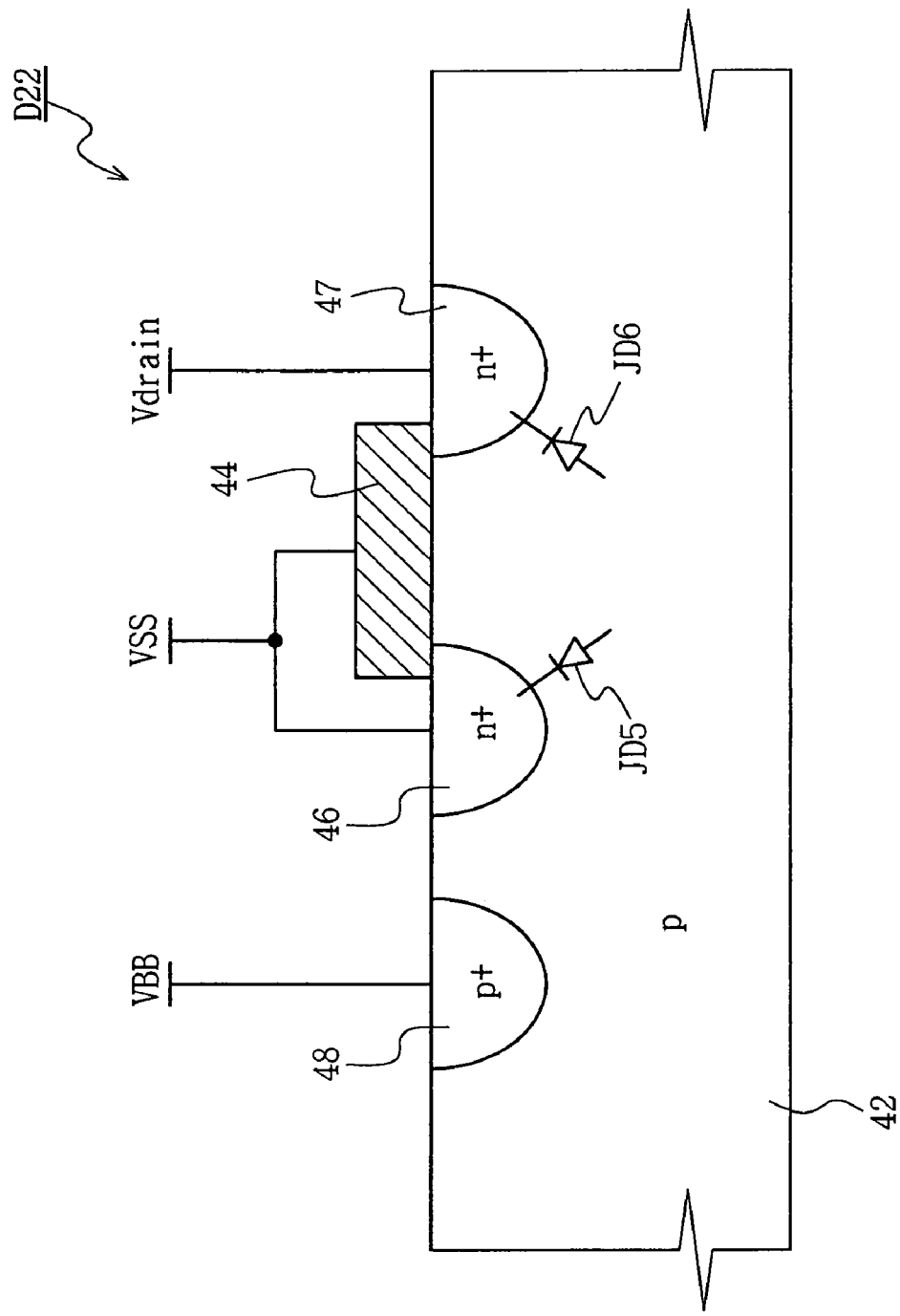
FIG. 10 is a sectional view schematically illustrating a vertical structure of a second electrostatic discharge diode illustrated in FIG. 7.

FIG. 10 is a sectional view schematically illustrating a vertical structure of second ESD diode D22 of FIG. 7 where the circuit of FIG. 7 is included in one of multiple semiconductor chips included in a memory module.

Referring to FIG. 10, second ESD diode 22 comprises an NMOS transistor including a gate 44, a source 46, and a drain 47. Gate 44 and source 46 are both connected to ground VSS and drain 47 is connected to a drain voltage Vdrain. In addition, the NMOS transistor includes a p-type body 42 connected to voltage VBB. Each of source 46 and drain 47 are formed by a well comprising a region into which n-type impurities of a high density are implanted. A region 48 is also formed in body 42 by implanting p-type impurities with a high density into body 42. A junction diode JD5 is positioned between body 42 and source 46 of the NMOS transistor and a junction diode JD6 is positioned between body 42 and drain 47 of the NMOS transistor. Although a gate oxide is typically included in the NMOS transistor, no gate oxide is explicitly shown in order to simplify the drawings.

Voltage VBB lower than ground voltage VSS is applied to body 42 in region 48. Ground VSS is applied to source 46 and gate 44, and drain voltage Vdrain is applied to drain 47. Drain voltage Vdrain is the voltage apparent at node N20 shown in FIG. 7.

As described above, where reverse bias voltages in body 42 of second ESD diode D22 increase, capacitance of electrostatic discharge circuit 200 decreases according to mathematical formula (1).

Figure 11:
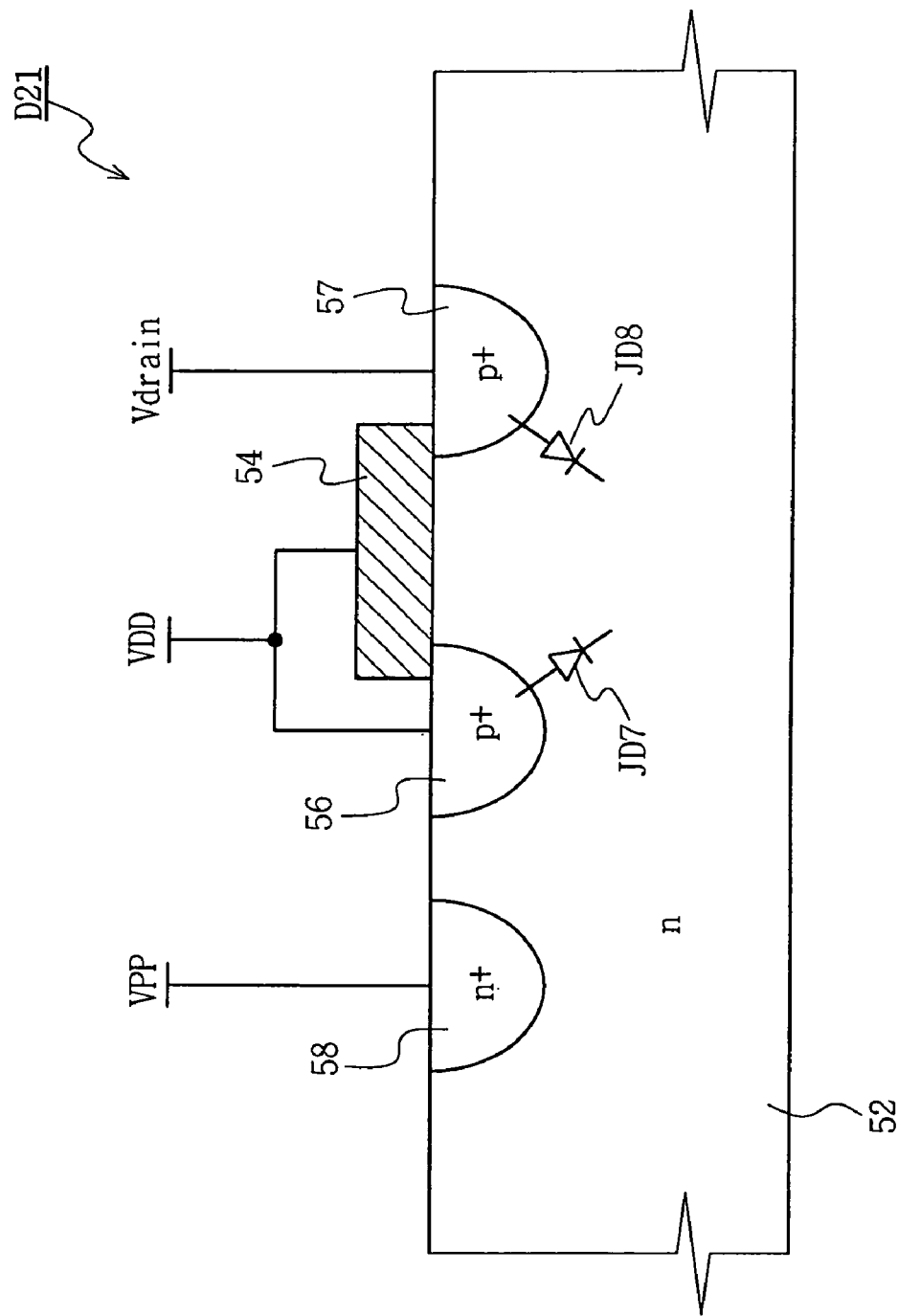
FIG. 11 is a sectional view schematically illustrating a vertical structure of a first electrostatic discharge diode illustrated in FIG. 7; and, FIGS. 12 and 13 are graphs illustrating an increased setup margin of a semiconductor device according to an embodiment of the invention relative to a setup margin of a conventional semiconductor device.

FIG. 11 is a sectional view schematically illustrating a vertical structure of first ESD diode D21 shown in FIG. 7 where the circuit of FIG. 7 is included in one of multiple semiconductor chips included in a semiconductor device such as a memory module.

Referring to FIG. 11, first ESD diode 21 comprises a PMOS transistor including a gate 54, a source 56, and a drain 57. Gate 54 and source 56 are both connected to power source voltage VDD and drain 57 is connected to drain voltage Vdrain. In addition, the PMOS transistor includes a n-type body 52 connected to voltage VPP, which is higher than power source voltage VDD. Each of source 56 and drain 57 are formed by a well comprising a region into which p-type impurities of a high density are implanted. A region 58 is also formed in body 52 by implanting n-type impurities with a high density into body 42. A junction diode JD7 is positioned between body 52 and source 56 of the PMOS transistor and a junction diode JD8 is positioned between body 52 and drain 57 of the PMOS transistor. Although a gate oxide is typically included in the PMOS transistor, no gate oxide is explicitly shown in order to simplify the drawings.

Voltage VPP higher than power source voltage VDD is applied to body 52 in region 58. Power source voltage VDD is applied to gate 54 and source 56, and drain voltage Vdrain is applied to drain 57. Drain voltage Vdrain is a voltage apparent at node N20 shown in FIG. 7.

Where reverse bias voltages in body 52 of first ESD diode D21 increase, capacitance of the electrostatic discharge circuit reduces as illustrated by mathematical formula (1). Where input capacitance of the semiconductor chip is reduced, certain defects in operation or performance degrading problems due to lack of setup margin etc. in operation of a memory module can be avoided.

Figure 12:
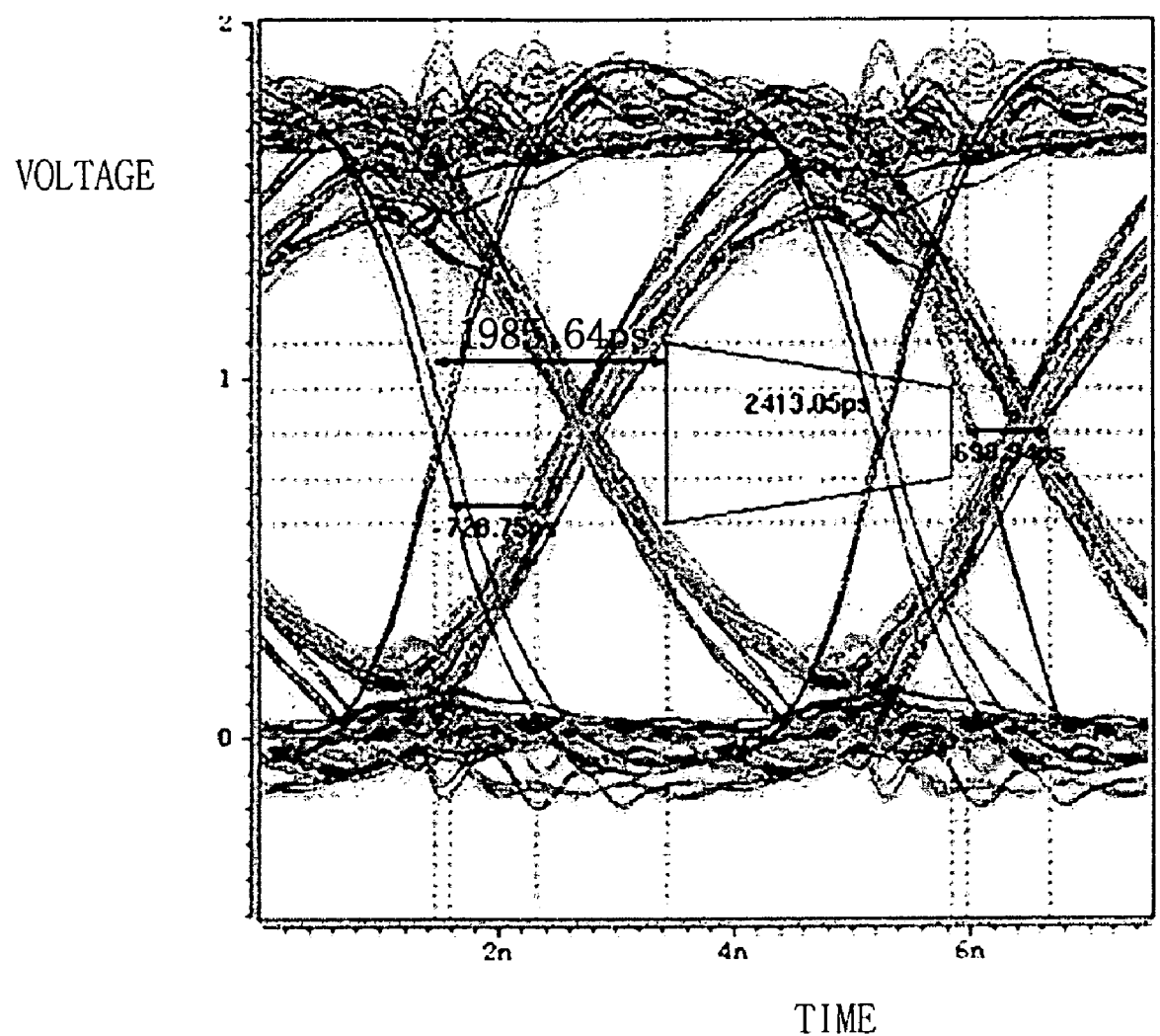
Figure 13:
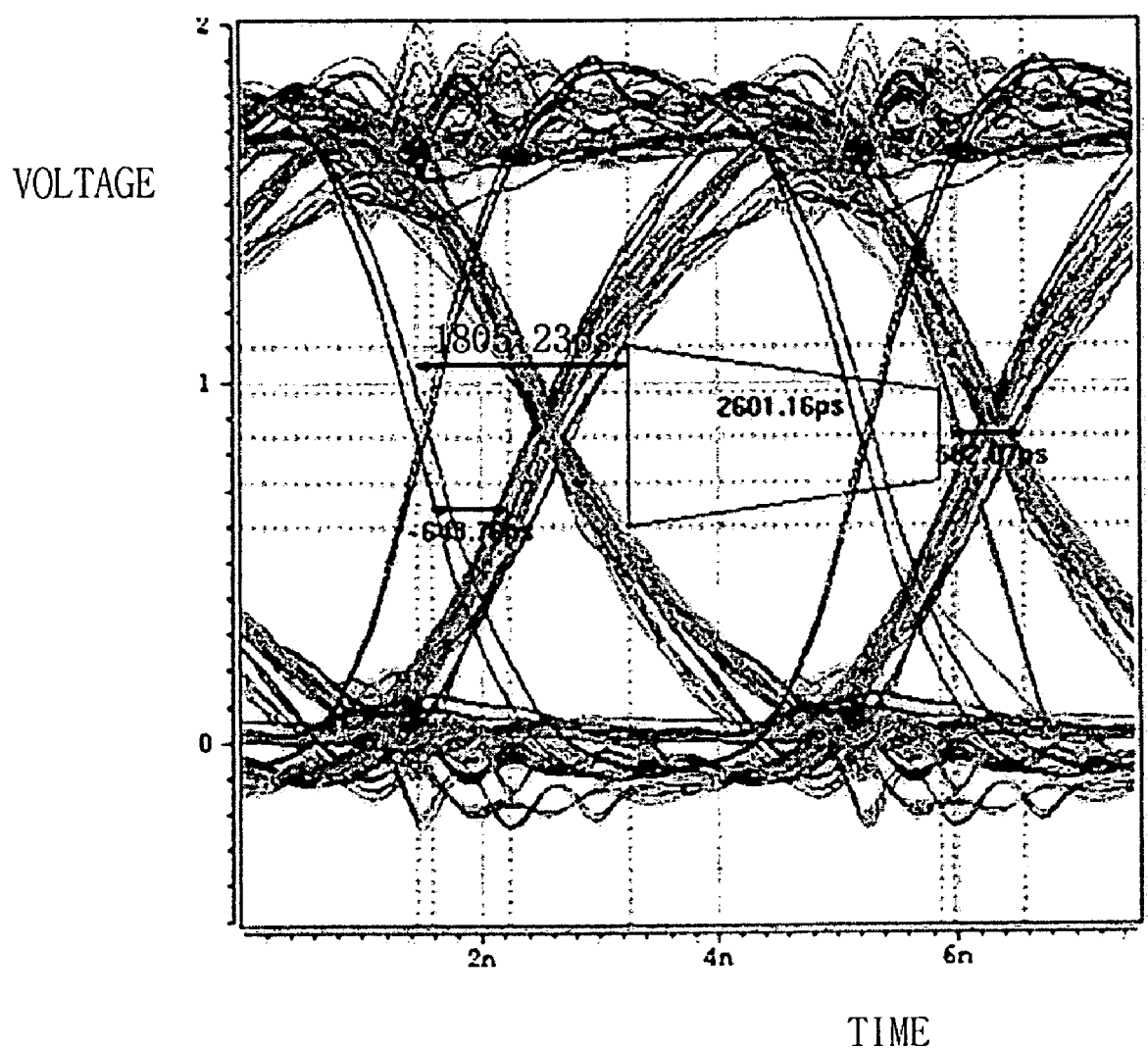

FIGS. 12 and 13 are graphs illustrating an increased setup margin of a semiconductor device according to an embodiment of the invention relative to a setup margin of a conventional semiconductor device. In particular, FIG. 12 illustrates a setup margin of a conventional semiconductor device and FIG. 13 illustrates a corresponding setup margin of a semiconductor device according to an embodiment of the invention.

FIG. 12 illustrates a net delay of a command address in a conventional memory module including four semiconductor chips, i.e., a conventional 4-stack DRAM package. FIG. 13 illustrates a net delay of command address in a memory module including four semiconductor chips, i.e., a 4-stack DRAM package according an embodiment of the invention. The net delay indicates a delay from a reference chip in the memory module to a test chip.

Based on the data of FIG. 12, the conventional semiconductor device has an input capacitance about 0.8 pF, as computed with equation (1), and based on the data of FIG. 13, the semiconductor device according to an embodiment of the invention has an input capacitance of about 0.5 pF, as computed with equation (1).

In other words, according to equation (1), where the reverse bias increases by 6V, a junction capacitance is reduced about 0.3 pF. In another description for a relation between FIGS. 12 and 13, where a reverse bias increases by 6V in an electrostatic discharge circuit of a semiconductor chip based on the graph of FIG. 12, the result may be provided as a graph of FIG. 13. As illustrated by these graphs, a net delay and a setup margin of a semiconductor device are related. For instance, a net delay shown in FIG. 12 is 1985.64 ps, and a net delay shown in FIG. 13 is 1805.23 ps. As reverse bias increases, the net delay is reduced and the setup margin increases. Accordingly, defects in operation or performance degradation due to lack of setup margin in the operation of memory modules can be avoided by adopting selected embodiments of the invention.

Selected embodiments of the invention provide advantages where multiple semiconductor chips are driven by a single output pin of a driver of a memory module. The driver may comprise, for example, a control chip of a main board in a UDIMM or a SODIMM, a register in a RDIMM, or an AMB in a FBDIMM.

A method of reducing an input capacitance of a semiconductor chip according to selected embodiments of the invention includes performing a control operation so that a body voltage of a PMOS transistor constituting a diode within an electrostatic discharge circuit becomes a power source voltage of the electrostatic discharge circuit, and a body voltage of a NMOS transistor constituting a diode within the electrostatic discharge circuit becomes ground when the semiconductor chip is a sole semiconductor chip in a semiconductor device. The method further comprises performing a control operation so that the body voltage of the PMOS transistor becomes higher than the power source voltage and the body voltage of the NMOS transistor becomes lower than ground when the semiconductor chip is one of multiple semiconductor chips in a semiconductor device such as a memory module.

The method of reducing the input capacitance may further include performing a control operation to change the body voltage of the PMOS transistor from the voltage higher than the power source voltage back to the power source voltage and the body voltage of the NMOS transistor from the voltage lower than ground back to ground where the semiconductor chip is switched from a device including a plurality of chips to a device including a sole chip.

As described above, an ESD circuit and a related method may be used to reduce an input capacitance of a semiconductor chip. Accordingly, internal circuits of the semiconductor chip may be protected from static electricity while maintaining a relatively low input capacitance for the semiconductor chip.

In addition, defects in operation or a performance degrading problem caused by a lack of setup margin etc. in operation of a memory module may be solved, with increasing the number of semiconductor chips drivable per one output pin of a driver of a memory module.

The foregoing exemplary embodiments are teaching examples. Those of ordinary skill in the art will understand that various changes in form and details may be made to the exemplary embodiments without departing from the scope of the invention as defined by the claims.

What is claimed:

1. A multi-mode electrostatic discharge (ESD) circuit for a semiconductor chip comprising an input buffer, the circuit comprising:
one or more ESD diodes connected to an input terminal of the input buffer and adapted to discharge static electricity applied to the input terminal of the input buffer; and
one or more body voltage varying units adapted to apply one or more respective body voltages to the one or more ESD diodes;
wherein each of the one or more respective body voltages has a voltage level greater than a power source voltage of the ESD circuit or less than a ground voltage of the ESD circuit where the ESD circuit is in a first mode, and further adapted to apply the one or more respective body voltages to the one or more ESD diodes with respective voltage levels equal to the power source voltage of the ESD circuit or the ground voltage of the ESD circuit where the ESD circuit is in a second mode.

2. The circuit of claim 1, wherein the one or more ESD diodes comprises:
a first ESD diode connected between a power terminal and the input terminal of the input buffer and reverse-biased when the static electricity is not applied to the input terminal; and
a second ESD diode connected between the input terminal of the input buffer and a ground terminal and reverse-biased when the static electricity is not applied to the input terminal.

3. The circuit of claim 2, wherein the first electrostatic discharge diode comprises:
a positive metal-oxide semiconductor (PMOS) transistor having a body, a drain connected to the input terminal of the input buffer, and a source and gate both connected to the power terminal.

4. The circuit of claim 3, wherein the one or more body voltage varying units comprises:
a first body voltage varying unit adapted to supply the body of the PMOS transistor with the body voltage having the level greater than the power source voltage of the ESD circuit where the ESD circuit is in the first mode.

5. The circuit of claim 2, wherein the second ESD diode comprises a negative metal-oxide semiconductor (NMOS) transistor having a body, a drain connected to the input terminal of the input buffer, and a source and a gate both connected to the ground terminal.

6. The circuit of claim 5, wherein the one or more body voltage varying units comprises:
a first body voltage varying unit adapted to supply the body of the NMOS transistor with the body voltage having the level less than the ground voltage of the ESD circuit where the ESD circuit is in the first mode.

7. The circuit of claim 1, wherein the first mode is employed where the semiconductor chip is one among multiple semiconductor chips in a memory module and the second mode is employed where the semiconductor chip is not one among multiple semiconductor chips in a memory module.

8. A multi-mode electrostatic discharge (ESD) circuit for a semiconductor chip comprising an input buffer, the circuit comprising:
one or more ESD diodes connected to an input pad acting as an input terminal for an external signal of the semiconductor chip, and further connected to an input terminal of the input buffer, and adapted to discharge static electricity applied to the input pad; and
one or more body voltage varying units adapted to apply one or more respective body voltages to the one or more ESD diodes;
wherein each of the one or more respective body voltages has a voltage level greater than a power source voltage of the ESD circuit or less than a ground voltage of the ESD circuit where the ESD circuit is in a first mode, and further adapted to apply the one or more respective body voltages to the one or more ESD diodes with respective voltage levels equal to the power source voltage of the ESD circuit or the ground voltage of the ESD circuit where the ESD circuit is in a second mode.

9. The circuit of claim 8, wherein the one or more ESD diodes comprises:
a first ESD diode connected between a power terminal and the input terminal of the input buffer and reverse-biased when the static electricity is not applied to the input pad; and
a second ESD diode connected between the input terminal of the input buffer and a ground terminal and reverse-biased when the static electricity is not applied to the input pad.

10. The circuit of claim 9, wherein the first ESD diode comprises:
a positive metal-oxide semiconductor (PMOS) transistor having a body, a drain connected to the input terminal of the input buffer, and a source and gate both connected to the power terminal.

11. The circuit of claim 10, wherein the one or more body voltage varying units comprises:
a first body voltage varying unit adapted to supply the body of the PMOS transistor with the body voltage having the level greater than the power source voltage of the ESD circuit where the ESD circuit is in the first mode.

12. The circuit of claim 9, wherein the second ESD diode comprises:
a negative metal-oxide semiconductor (NMOS) transistor having a body, a drain connected to the input terminal of the input buffer, and a source and a gate both connected to the ground terminal.

13. The circuit of claim 12, wherein the one or more body voltage varying units comprises:
a first body voltage varying unit adapted to supply the body of the NMOS transistor with the body voltage having the level less than the ground voltage of the ESD circuit where the ESD circuit is in the first mode.

14. The circuit of claim 8, wherein the first mode is employed where the semiconductor chip is one among multiple semiconductor chips in a memory module and the second mode is employed where the semiconductor chip is not one among multiple semiconductor chips in a memory module.

15. A multi-mode electrostatic discharge (ESD) circuit for a semiconductor chip having an input buffer, the circuit comprising:
first and second ESD diodes, each connected to an input pad provided as an input terminal for an external signal supplied to the semiconductor chip and further connected to the input buffer and providing respective first and second discharge paths for discharging static electricity applied to the input pad;
a first body voltage varying unit adapted to receive a first selection signal and to generate a body voltage for the first ESD diode based on a voltage level of the first selection signal, which is determined by a mode of the ESD circuit;

a second body voltage varying unit adapted to receive a second selection signal and to generate a body voltage for the second ESD diode based on a voltage level of the second selection signal, which is determined by the mode of the ESD circuit;

wherein the first body varying unit generates the body voltage for the first ESD diode with a voltage level higher than a power source voltage of the ESD circuit where the mode of the ESD circuit is a first mode, and generates the body voltage for the first ESD diode with a voltage level substantially equal to the power source voltage of the ESD circuit where the mode of the ESD circuit is a second mode; and wherein the second body varying unit generates the body voltage for the second ESD diode with a voltage level lower than a ground voltage of the ESD circuit where the mode of the ESD circuit is the first mode, and generates the body voltage for the second ESD diode with a voltage level substantially equal to the ground voltage of the ESD circuit where the mode of the ESD circuit is the second mode.

16. The circuit of claim 15, wherein the first ESD diode comprises:

a first positive metal-oxide semiconductor (PMOS) transistor having a body, a drain connected to an input terminal of the input buffer, and a source and gate both connected to a power terminal.

17. The circuit of claim 16, wherein the first body voltage varying unit comprises:

a second NMOS transistor adapted to turn on in response to the first selection signal where the mode of the ESD circuit is the first mode to provide the body voltage for the first ESD diode with the voltage level higher than the power source voltage of the ESD circuit to the body of the first PMOS transistor; and a second PMOS transistor adapted to turn on in response to the first selection signal where the mode of the ESD circuit is the second mode to provide the body voltage for the first ESD diode with the voltage level substantially equal to the power source voltage of the ESD circuit to the body of the first PMOS transistor.

18. The circuit of claim 15, wherein the second ESD diode comprises:

a first negative metal-oxide semiconductor (NMOS) transistor having a body, a drain connected to an input terminal of the input buffer, and a source and a gate both connected to a ground terminal.

19. The circuit of claim 18, wherein the second body voltage varying unit comprises:

a third NMOS transistor adapted to turn on in response to the second selection signal where the mode of the ESD circuit is the first mode to provide the body voltage for the second ESD diode with the voltage level lower than the ground voltage of the ESD circuit to the body of the first NMOS transistor; and a third PMOS transistor adapted to turn on in response to the second selection signal where the mode of the ESD circuit is the second mode to provide the body voltage for the second ESD diode with the voltage level substantially equal to the ground voltage of the ESD circuit to the body of the first NMOS transistor.

20. The circuit of claim 15, wherein the first mode is employed where the semiconductor chip is one among multiple semiconductor chips in a memory module and the second mode is employed where the semiconductor chip is not one among multiple semiconductor chips in a memory module.

21. A method of reducing an input capacitance of a semiconductor chip having an electrostatic discharge (ESD) circuit comprising first and second ESD diodes and adapted to protect internal circuits of the semiconductor chip from static electricity, the method comprising:

in a first mode of the ESD circuit, generating a body voltage for a positive metal-oxide semiconductor (PMOS) transistor included in the first ESD diode with a voltage level substantially equal to a power source voltage of the ESD circuit and generating a body voltage for a negative metal-oxide semiconductor (NMOS) transistor included in the second ESD diode with a voltage level substantially equal to a ground voltage of the ESD circuit; and in a second mode of the ESD circuit, generating the body voltage for the PMOS transistor included in the first ESD diode with a voltage level higher than the power source voltage of the ESD circuit and generating the body voltage for the NMOS transistor included in the second ESD diode with a voltage level lower than the ground voltage of the ESD circuit.

* * * * *